(12) United States Patent
Switlyk

(10) Patent No.: US 6,496,687 B1
(45) Date of Patent: Dec. 17, 2002

(54) COMPUTER-BASED RADIO SCANNER INTERNET SYSTEM

(76) Inventor: George Switlyk, 11 S. Deer Hill Rd., Lebanon, NJ (US) 08833

( * ) Notice: Subject to any disclaimer, the term of this patent is extended or adjusted under 35 U.S.C. 154(b) by 0 days.

(21) Appl. No.: 09/354,033

(22) Filed: Jul. 15, 1999

Related U.S. Application Data

(63) Continuation-in-part of application No. 09/333,838, filed on Jun. 15, 1999.

(51) Int. Cl.[7] .................................................. H04B 1/18
(52) U.S. Cl. .............................. 455/150.1; 455/154.1; 455/161.2; 455/186.1; 709/217
(58) Field of Search .......................... 455/150.1, 151.1, 455/151.4, 154.1, 154.2, 419, 420, 161.1, 161.2, 179.1, 180.1, 185.1, 186.1, 186.2; 709/217, 218, 219

(56) References Cited

U.S. PATENT DOCUMENTS 6,289,207 B1 * 9/2001 Hudecek et al. ......... 455/150.1
6,389,463 B2 * 5/2002 Bolas et al. ................ 709/219

* cited by examiner

Primary Examiner—Lee Nguyen
(74) Attorney, Agent, or Firm—Kenneth P. Glynn, Esq.

(57) ABSTRACT

The present invention is a computer-based radio scanner internet system, with home base user computers with radio scanner hardware and software, a host server computer, a plurality of remotely located antenna computers connected to antennas, and an internet system. The user computer also has conventional operating hardware and software, a sound system, a monitor, a keyboard or mouse, as well as disc drive, CD Rom drive. The radio scanner hardware contained within the user computer includes a radio receiver and frequency changer with a scanner range having at least some frequencies in the range of 25 MHz to 1,300 MHz. The antenna computers are available via the internet connection for connecting to user computers to offer remote scanning of even an intercontinental nature, e.g., a user in Boston can, through this system, use his computer-based scanner to scan frequencies in, for example, Los Angeles. Local scanning is also available using the foregoing user computers with their own antennas.

20 Claims, 3 Drawing Sheets

COMPUTER-BASED RADIO SCANNER INTERNET SYSTEM

REFERENCE TO RELATED APPLICATION

This application is a Continuation-in-Part of currently pending U.S. patent application Ser. No. 09/333,838, filed on Jun. 15, 1999, and entitled "Computer-Based Radio Scanner System" by the inventor herein.

BACKGROUND OF THE INVENTION

1. Field of the Invention

The present invention relates to scanner radios typically used to monitor emergency calls and governmental transmittals such as police, emergency squad, highway patrol, forest ranger and other channels. More particularly, the present invention relates to radio scanner internet systems which include a plurality of computers having radio scanner hardware and software built into them, and which are connectable to a variety of remote antennas via internet connection.

2. Information Disclosure Statement

A scanner radio user can listen to a multitude of frequencies whilst the ordinary radio (AM/FM) can only be tuned to but one station. An ordinary radio is thus tuned to a continuous transmission while the scanner radio is tuned to transmissions when they occur. A particular frequency may only have a transmission sparsely. This enables scanners to monitor hundreds of stations (frequencies) at the same time.

Present day use of radio scanners is extremely widespread in the United States of America and scanning is used for many purposes including information gathering, private hobbying, volunteer alerting, news gathering, etc.

Radio scanners are used to follow law enforcement activities, fire fighters, emergency and rescue squads, highways, forestry, aircraft, railroads, utilities, business, transportation, schools, sports, theme parks, governments (federal, state, county, local), military and other non AM/FM radio communications. Scanner users and Ham operators have evolved into more sophisticated purchasers of equipment and complex and very wide range band equipment is commercially available. Some scanner devices are smaller manual devices like transistor radios in size and simplicity, while others now have input chips and can have preset or preselected frequencies. However, the technology has not merged with other technologies in existence and no equipment exists or suggests the combination of scanner hardware, scanner software, computer CPU/monitor/input operations integrated with changing frequency information and remotely located signal receiving capabilities via the internet, as in the present invention.

The internet is used today to provide users with access to radio stations, TV stations, music, concerts, etc. However, such systems are based on hardware/software remotely located from the users' computers and operate with conventional computers. On the other hand, the present invention includes modified computers having radio scanner hardware and software built into them and only use the internet to select and connect to remote antennas, to increase scanner channel options for the users.

Thus, notwithstanding the prior art, the present invention is neither taught nor rendered obvious thereby.

SUMMARY OF THE INVENTION

The present invention is a computer-based radio scanner internet system. It includes a plurality of home base user computers with radio scanner hardware and software contained therein, at least one host server computer, a plurality of remotely located antenna computers connected to antennas, and an internet system connecting these. The home base user computer has a conventional microprocessor with a CPU having operating system hardware and software for conventional microprocessing, including same for operating a sound system. A monitor and a data input means, such as a keyboard or mouse, as well as disc drive, CD Rom drive or other electronic data input means, are also included. There is radio scanner hardware contained within the microprocessor including a radio receiver and a frequency changer with a scanner range having at least some frequencies in the range of 25 MHz to 1,300 MHz. Radio scanner software is included with the microprocessor and scanner hardware to permit a user to operate the radio scanner hardware through the input mechanism of the microprocessor. The plurality of remote antenna computers are available via the internet connection for connecting to home base user computers to offer remote scanning of even an intercontinental nature, e.g., a user in Boston can, through this system, use his computer-based scanner to scan frequencies in, for example, Los Angeles.

In most preferred embodiments, the home base user computers have their own antennas for internet-free scanning and the software and hardware provide to the user the ability to switch from the internet-free local scanning capabilities to the universal internet scanning capabilities of the present invention. Thus, by utilizing its own antenna for local scanning, there is no need to interconnect with the internet. When the user exercises the option of switching to the internet system, the host server web page will enable the user to select not only locations or regions but also any and all frequencies which the remote antenna would receive just as if the user were at that remote location.

In preferred embodiments, the scanner hardware of the user computers may be in the form of a removable board or card inserted into the microprocessor. In some preferred embodiments, the radio scanner sound operates independently of the other available computer operations, thereby enabling the user to listen to the scanner radio while conducting other routine computer functions.

BRIEF DESCRIPTION OF THE DRAWINGS

The present invention should be more fully understood when the specification herein is taken in conjunction with the drawings appended hereto wherein.

DETAILED DESCRIPTION OF THE PRESENT INVENTION

Present day scanner radios are lightweight and portable and yet have more sophisticated capabilities than earlier scanner radios. Current technology includes circuit board/microchip components with compact tuner capabilities. This state-of-the-art hardware is the preferred hardware contained within the computer-based radio scanner system of the present invention. Thus, the present invention involves a plurality of user computers which contain a radio scanner system and internet connectability, an internet host computer, and a plurality of antenna computers connected to at least one antenna. Its purpose is to enable users to effectively scan with a computer-based scanner radio instead of a conventional radio scanner and to utilize the Internet to select and hook up to antennas anywhere the system makes them available.

In most preferred embodiments, the home base user computers have their own antennas for internet-free scanning and the software and hardware provide to the user the ability to switch from the internet-free local scanning capabilities to the universal internet scanning capabilities of the present invention. Thus, by utilizing its own antenna for local scanning, there is no need to interconnect with the internet. When the user exercises the option of switching to the internet system, the host server web page will enable the user to select not only locations or regions but also any and all frequencies which the remote antenna would receive just as if the user were at that remote location. Thus, the user is not limited to being able to only scan selected frequencies from remote receivers because the home base user computer receiver itself still controls frequency selections on the internet system.

Figure 1:
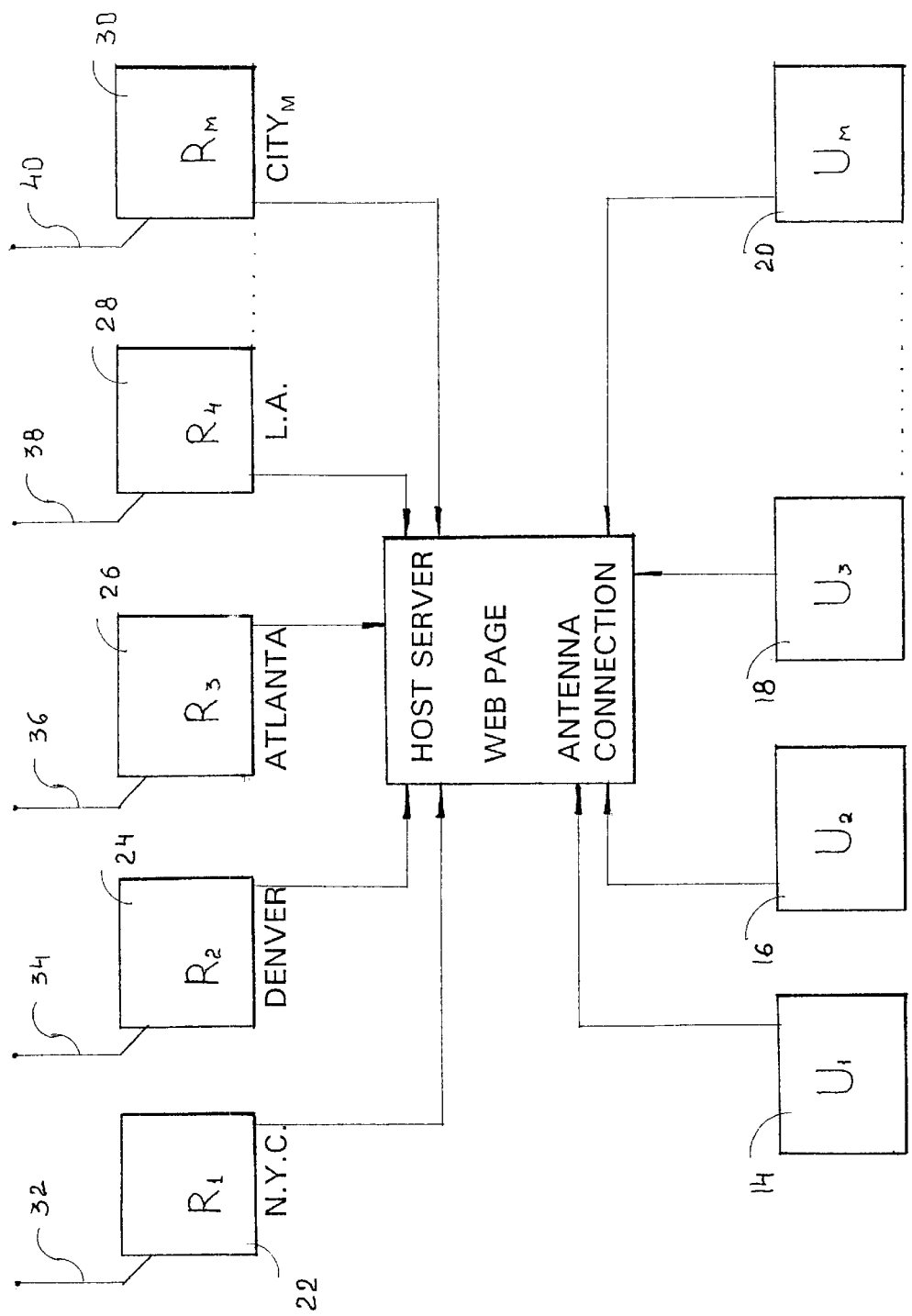
FIG. 1 shows a diagrammatic illustration of one embodiment of the present invention computer-based radio scanner internet system.

FIG. 1 illustrates a diagram showing the present invention computer-based radio scanner internet system 10. There are a plurality of home base user computers 14, 16, 18 and 20, designated as U1, U2, U3 ... $U_n$, where n is the total number of home base user computers. The home base user computers 14, 16, 18 and 20 include conventional hardware and software, as well as software and hardware (or firmware) which enable the users to operate a scanner radio contained in their computer to pick up both local and remote city signals for any region or city covered by the system. The details of these home base user computers are set forth in conjunction with FIGS. 2 and 3 described below.

Host server 12 is a server which operates a web page enabling users to connect physically to any remote antenna in the United States or beyond that is available in the system.

While host server 12 is described as one or more host server computers, it basically represents the web base or web page of the system of the present invention. Without exceeding the scope of the present invention, the actual internet server computer or computers and the operating computer for the overall system could be different from one another and located remotely apart from one another. Further, the combination of an internet server and an operating system computer for the present invention system shall be collectively referred to as the host server herein. The system host server may include account management, subprograms for handling such features as account management, billings and flow management of users, as well as "traffic control". It may also be re-programmable from remote by secured entry to expand, delete or change home base user options, including, but not limited to regions and/or frequencies available to the home base user computers.

The software utilized within the present invention system host server web page and/or home base user computer may include preferred list options for selected frequency for a given region to create a preferred list of frequencies similarly, the software may include providing for the selection of preferred regions or antennas, as well as preferred frequency lists within each preferred region.

Host server 12 is connected via the internet to a plurality of remote antenna computers 22, 24, 26, 28 and 30. These are designated as remote antenna computer R1, R2, R3, R4 and $R_m$ where m is the total number of remote antenna computers in the system. These remote antenna computers are connected or indirectly thereto antenna 32, 34, 36, 38 and 40, respectively, representing various remotely located separate regions. These antenna computers receive signals through the antennas for connection through the internet to the user computers in response to the user's particular antenna selections and frequency selection is controlled at the home base user computer via the receiver/tuner hardware.

Figure 2:
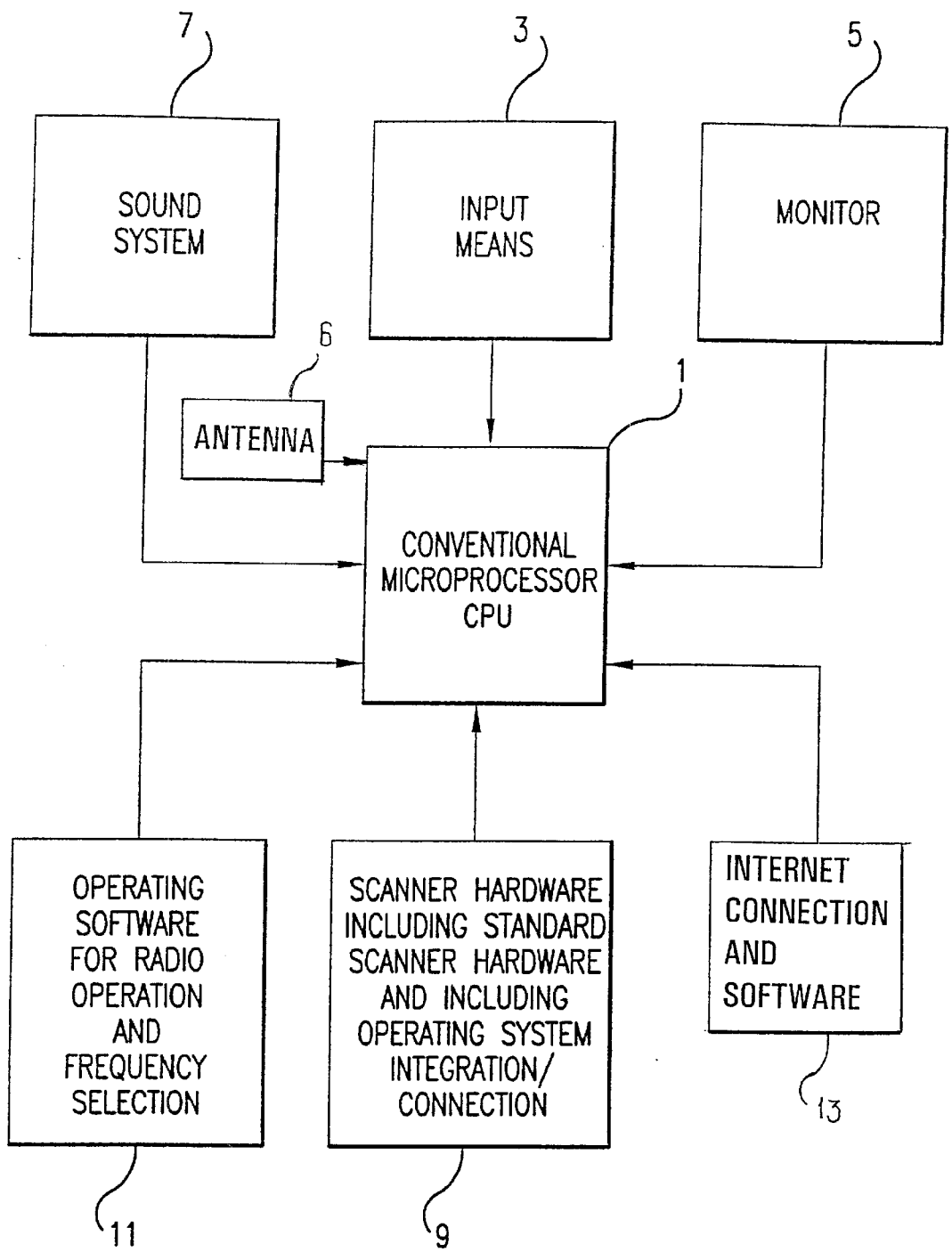
FIG. 2 shows a diagrammatical illustration of a home base user computer which is used in the present invention radio scanner internet system; and, FIG. 3 illustrates in table form the features of one preferred embodiment of a computer containing a computer-based radio scanner system.

FIG. 2 illustrates a diagrammatic representation of a user computer with a radio scanner for the present invention system. It includes a conventional microprocessor 1. This conventional microprocessor 1 is essentially a computer with an appropriate central processing unit with operational system software. It could be a personal computer, a mainframe computer, a portable computer or any other available computer format. Input means 3 is connected to conventional microprocessor 1 and may take the form of a keyboard, a mouse, a trackball or voice activated input means, touch pad or other available input means. Monitor 5 may be built into microprocessor 1 or it may be a separate unit connected thereto. Likewise, sound system 7 would include speaker(s), sound cards and operating software and may be a separate unit connected to the conventional microprocessor 1 or may be built into-conventional microprocessor 1.

Also included in conventional computer microprocessor 1 is operating software 11 for radio operation and frequency selection, and scanner hardware 9 with radio scanner hardware which includes operating system integration and connection. An antenna 6 is connected to conventional computer microprocessor 1 and particularly to operate with scanner hardware 9. Internet connection 13 can be built into conventional microprocessor 1, such as a modem and proper internet software or connected thereto via an internal server or otherwise within an intranet system at a user's location. Thus, the user merely operates with its own antenna 6 for internet-free local scanning and switches to the internet and via its web page selects the remote antenna of its choice for long distance real time full frequency availability scanning.

The following is an example of operation of scanner software which could be used in the user computers in conjunction with the system of the present invention when in the internet remote antenna mode:

1) Select "radio scanner" from "programs" menu or from icon;
2) Choice screen offers:
 a) Instructions;
 b) Directory;
 c) Prompter for selecting frequencies from available regional antenna sites or frequency or frequency ranges or copying in a list from a data source at the web page such as a regional antenna site list. (For example, a CD ROM will provide a list as a result of a specific search and the selected frequencies can be transferred to a personal frequency page for implementation to the radio scanner, or for subsequent selection of frequencies for connection via the server to the remote antenna);
 d) Optional preferred list editing for alternative selection;
3) Optional select directory for addition to preferred list;
4) Select region;
5) Select "on" to scan;

6) Return to other computer activities, as desired, while listening;

7) When finished, exit.

The above sequence is only one of a number of possible program architectures for operating the present invention radio scanner features. For example, a regional antenna site selection screen may appear to enable a user to copy in from a regional antenna site directory for creation of a preferred list. Alternatively, a frequency screen may appear with selected lists from a directory, and the user may simply "click" the selections, as follows:

Frequency Screen 1. 151.2350
2. 33.4200 X
3. 33.6800
4. 154.7850 X
5. 155.3400
.
.
.
N Where N is the number of frequencies.

Editing may be accomplished by simple modifications such as:

Add frequency by keyboard;

Delete frequency by backspacing;

Activate frequency by clicking in square;

Deactivate frequency by clicking in dotted square; and,

Close screen frequency by clicking.

Figure 3:
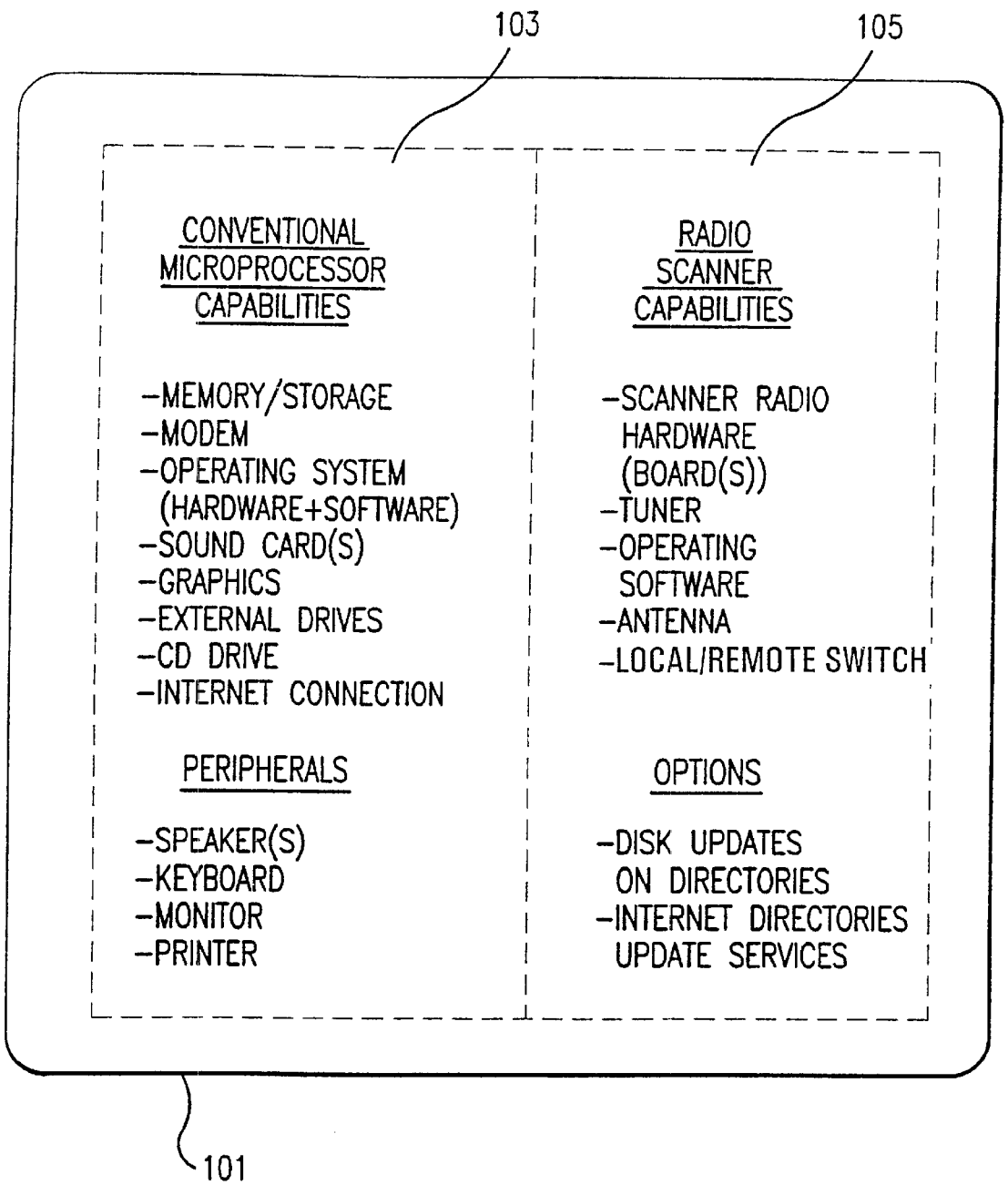

FIG. 3 shows a diagrammatic representation of a user computer 101 which includes conventional microprocessor capabilities 103 and radio scanner capability 105. Optional capabilities for the radio scanner include directory updates e.g. by floppy disk, cds or otherwise. Alternatively, or in addition to disk updates, internet directory update services could be included.

Obviously, numerous modifications and variations of the present invention are possible in light of the above teachings. It is, therefore, understood that within the scope of the appended claims, the invention may be practiced otherwise than as specifically described herein.

What is claimed is:

1. A computer-based radio scanner internet system, which comprises:

A. plurality of home base user computers having radio scanner capabilities, each of said home base user computers having:

a.) a conventional microprocessor having a central processing unit with operating system hardware and software for conventional microprocessing, including sufficient hardware and software to operate a sound system;

b.) a sound system connected to said microprocessor, said sound system having at least one speaker;

c.) input means connected to said microprocessor for inputting instructions thereto;

d.) a monitor connected to said microprocessor for displaying predetermined information;

e.) radio scanner hardware means connected to said microprocessor, which includes a radio receiver, a frequency changer, and a scanner range which includes at least some frequencies in the range of 25 MHz to 1300 MHz; and, f.) radio scanner software contained within said system adapted to connect and function with said microprocessor and said input means so as to operate said radio scanner hardware;

g.) an antenna connected to said system for receiving radio signals from the airways, inputting said radio signals to said system and transmitting sound to a user via said sound systems;

B. at least one host server processor;

C. a plurality of antenna computers each of which is connected to an antenna and is adapted to make antenna connections to said host server processor to permit users to connect to a plurality of antennas;

D. a plurality of antenna remotely located from one another and each being connected to at least one of said antenna computers;

E. an internet system connecting said home base-user computers, said host server processor and said plurality of antenna computers.

2. The system of claim 1 wherein said scanner hardware means of said user computers is a scanner card which is functionally and removably installed within said microprocessor CPU.

3. The system of claim 1 wherein said home base user computers further include an antenna connected functionally to its scanner hardware and software to permit a user radio scanning on an internet-free local basis, and includes means for switching from internet to internet-free scanning and vice versa.

4. The system of claim 1 wherein said antenna computers are wired directly to at least one antenna adapted to receive scanner range frequencies, including at least some frequencies in the range of 25 MHz to 1300 MHz.

5. The system of claim 1 wherein said home base user computers further include at least one separate readable medium which is installable into said home base user computers for downloading frequency information thereto.

6. The system of claim 1 wherein said home base user computers include sufficient software to permit user to utilize sound system capabilities for radio scanning while using other unrelated non-scanning features simultaneously therewith.

7. The system of claim 1 wherein said radio scanner hardware means of said user computers further includes a frequency range containing AM radio and FM radio frequencies for single radio frequency selection.

8. The system of claim 1 wherein said home base user computers further include software to provide for automatically selecting frequencies to create a preferred list for scanning.

9. The system of claim 1 wherein said home base user computers further include software to provide for automatically selecting antenna regions to create a preferred list.

10. The system of claim 9 wherein said home base user computers further include software to provide for automatically selecting frequencies within each preferred antenna region contained within said preferred list of antenna regions to create a preferred list for scanning for each selected antenna region from a web site of said host server.

11. The system of claim 1 wherein said system includes portable computers as at least a portion of said plurality of home base user computers.

12. The system of claim 1 wherein said radio scanner software of said home base user computers is adapted to:

(i.) receive frequency information which includes at least names of transmitters, transmitter city and frequency;

(ii.) display said frequency information;

(iii.) permit a user to select a frequency from said display and automatically tune said radio scanner hardware means to said frequency; and, (iv.) broadcast received signals in audio form from said frequency via said sound system.

13. The system of claim 12 wherein said scanner hardware means of said home base user computers is a scanner card which is functionally and removably installed within said user computers.

14. The system of claim 12 wherein said input means is selected from and is instruction-receiving means, electromechanical instruction-receiving means and combinations thereof.

15. The system of claim 12 wherein said antenna computers are wired directly to at least one antenna adapted to receive scanner range frequencies, including at least some frequencies in the range of 25 MHz to 1300 MHz.

16. The system of claim 12 wherein said system further includes at least one separate readable medium which is installed in said home base user computers for downloading frequency information thereto.

17. The system of claim 12 wherein said radio scanner hardware means of said user computers further includes a frequency range containing AM radio and FM radio frequencies for single radio frequency selection.

18. The system of claim 12 wherein said host server includes connection software to connect said home base user computers to their selected antenna computers via a web site of said host server and further includes control software for individual home base user computer account management.

19. The system of claim 12 wherein said home base user computers further include software to provide for automatically selecting antenna sites to create a preferred list of scanning regions.

20. The system of claim 12 wherein said home base user computers further include software to provide for automatically selecting frequencies within each preferred region contained within preferred list of scanning regions to create a preferred list for scanning for each preferred region.

* * * * *